United States Patent [19]

Hockley et al.

[11] Patent Number: 4,747,077
[45] Date of Patent: May 24, 1988

[54] METHOD OF DETECTING THE CONDUCTANCE STATE OF A NON-VOLATILE MEMORY DEVICE

[75] Inventors: Peter J. Hockley; Michael J. Thwaites, both of Hook, England

[73] Assignee: The British Petroleum Company p.l.c., London, England

[21] Appl. No.: 760,740

[22] PCT Filed: Dec. 6, 1984

[86] PCT No.: PCT/GB84/00420
§ 371 Date: Jul. 22, 1985
§ 102(e) Date: Jul. 22, 1985

[87] PCT Pub. No.: WO85/02709
PCT Pub. Date: Jun. 20, 1985

[30] Foreign Application Priority Data
Dec. 10, 1983 [GB] United Kingdom ............... 8333033
Dec. 6, 1984 [GB] United Kingdom ........... PCT/GB84/00420

[51] Int. Cl.⁴ ............................................. G11C 11/42
[52] U.S. Cl. ......................................... 365/113; 357/2
[58] Field of Search .................... 365/113, 114; 357/2

[56] References Cited

U.S. PATENT DOCUMENTS 4,545,111 10/1985 Johnson .............................. 365/113

Primary Examiner—James W. Moffitt
Attorney, Agent, or Firm—Morgan & Finnegan

[57] ABSTRACT

Method of determining the conductance state of a non-volatile memory device switchable between high and low conductance states. The device comprises at least one p-type amorphous or microcrystalline semiconductor and an n or i-type layer. The device is irradiated with light to produce a photovoltaic response which is used to determine the conductance state.

7 Claims, 4 Drawing Sheets

METHOD OF DETECTING THE CONDUCTANCE STATE OF A NON-VOLATILE MEMORY DEVICE

This invention relates to a method for determining the state of a memory device.

IEE Proc., Vol 129, Pt I, Solid State and Electron Devices, No. 2, April, 1982, pages 51–54 discloses an electrically programmable non-volatile semiconductor memory device. In its simplest form this contains p and n layers of amorphous silicon deposited onto a conducting stainless steel substrate. The layered structure was formed into a memory device by applying a large forward bias of known polarity which switches the structure into a stable ON state. This step of "forming" permanently modifies the electrical properties of the device. The forming voltage was approximately 20 to 25 volts. After forming the device was then switched to the alternative OFF state by applying a voltage pulse above a low threshold such as 1 V with opposite polarity to the original pulse. The OFF state was stable for reverse bias voltage in excess of 10 V and for forward voltages of approximately 4–5 V. At higher forward voltages it switches to the ON state, i.e. the forward threshold voltage $V_{ThF}$ is 4–5 V. The ON state was stable for reverse bias voltages up to about 1 volt beyond which it switched to the OFF state i.e. the reverse bias threshold voltage $V_{ThR}$ was 1 V.

Our copending European patent application No. 83302665 discloses a memory device comprising an electrically conducting substrate and layers of i and p and/or n type amorphous or microcrystalline semi-conducting material which have been conditioned by the application of a voltage sufficiently large to cause the structure to be permanently modified to reduce the electrical resistance of the layers wherein no p and n layers are adjacent in the device.

Both devices have remarkably fast switches times of less than 100 ns.

U.S. Pat. No. 3,530,441 discloses amorphous memory devices which use light to read the memory state of a device by means of a measurement of a light related property e.g. refraction. It also discloses the use of light energy to produce a change in the memory state of a device. The change in memory state is detected by electrical measurements. There is no disclosure of the use of a junction type memory device. U.S. Pat. No. 3,530,441 is concerned with Ovshinsky-effect devices which do not rely on the presence of a junction, but on special properties of a single layer of material.

Japanese examined patent publication No. 55-39915 shows a device having a sandwich structure of a photoconductive layer and a chalogenide memory material (i.e. an Ovshinsky-effect type material). Irradiating the photoconductive layer with light gives a local reduction in resistance so applying a switching voltage to the chalogenide layer. The specification is thus concerned with writing to the device rather than with reading from it.

We have now discovered that memory amorphous or microcrystalline semiconductor junction devices possess a photovoltaic response when irradiated by light, the response differing substantially between the two conductivity levels characterising the ON and OFF states and that the response can be utilised to detect the state of the memory device.

Thus according to the present invention there is provided a process for detecting the conductance state of a non-volatile memory device which is switchable between a high conductance and a low conductance state and which comprises a plurality of amorphous or microcrystalline semiconductor layers at least one of which is a p-type layer in contact with an n or i-type layer, characterised by irradiating the device with light of a wavelength which causes band to band excitation and of an intensity which produces a detectable photovoltaic response and using the photovoltaic response to determine the conductance state of the device.

The photovoltaic response which is measured to determine the conductance state of the device may be the current across the device produced by irradiation, the voltage, or the power (the product of current and voltage).

The wavelength of the light is preferably less than 750 nm.

A laser is a suitable source of light.

The light may, if desired, be pulsed.

Response times of less than 500 ns may be obtained, thus optical reading can be used at frequencies up to 2 MHz, allowing either high speed data output or generation of a.c. output voltages which may be used or detected remotely, for example by a capacitive pick-up system.

The device must of course be constructed so that the junction can be irradiated. This may conveniently be done by using a transparent substrate on which successive layers of amorphous semiconductor are deposited.

Glass having an electrically conducting surface of tin oxide, indium tin oxide or other light permeable, electrically conducting material is a convenient transparent substrate.

Other structures may be used however. Thus the amorphous semiconductor layers may be deposited on a metal substrate, followed by a layer of transparent ITO (indium-tin oxide) to provide an electrical contact to the top layer of amorphous semiconductor.

Suitable structures include layers having the configuration p-i, p-n, p+-n and p-n+. A further layer can be added to p-n type structures to give p-i-n or p-n-i type structures. It is preferred to use structures which inherently have superior photovoltaic properties eg p-i and most preferably p-i-n.

The p, n or i-type amorphous or microcrystalline semiconductor material is a material which can be doped to provide p or n type conductivity (and in the case of p- and n-type material has been doped). For doping to be practicable the density of states in the gap between the valence band and the conduction band must be reduced to relatively low levels. The existence of a high density of states has been attributed to the presence of "dangling bonds". Techniques for reducing the density of states in amorphous and microcrystalline semiconductor material e.g. silicon are well-known. Thus the semiconductor material may be deposited in the presence of hydrogen and/or fluorine or may be treated with hydrogen or fluorine after deposition.

The semiconductor materials used in devices of the present invention may be elements of Group IV of the Periodic Table, eg Si, Ge, and components thereof eg SiC.

The layers of semiconductor material may be such as to produce homojunctions in which there is a junction between layers of the same material thus having the same band gap e.g. silicon. The device may also be a heterojunction device in which there is a junction between different materials having different band gaps e.g. silicon and silicon carbide.

The devices of the present invention are normally two electrode devices in contrast to multielectrode devices such as transistors.

By suitable choice of conditions for the deposition the semiconductor may be deposited in microcrystalline or amorphous form. Conditions favouring the deposition of amorphous semiconductor are well-known.

Layers of i-silicon can be made by methods known in the art, for example by decomposing silane in a glow discharge. Layers of p and p+ or n and n+ silicon can be made by adding diborane or phosphine respectively in varying quantities to the silane.

The silane and other decomposable gas if present are preferably in admixture with hydrogen and the total pressure controlled to obtain amorphous silicon.

In the case of silane/hydrogen mixtures the concentrations are preferably lower than those which are spontaneously combustible in air, eg about 5% by volume silane.

Desirably the device includes one or more electrically conducting areas on the outer surface of the silicon layer remote from the substrate. These areas can conveniently be provided by zones of a metal such as aluminium or a nickel chromium alloy.

The device comprising and layers of amorphous or microcrystalline semiconductor is formed to a memory device by applying a voltage sufficiently large to cause the device to be capable of being put into a stable conductance state by a voltage of known polarity and changed to a second conductance state by a voltage of opposite polarity.

The invention is illustrated with reference to the following Example and FIGS. 1 to 5 of the accompanying drawings in which.

EXAMPLE

An ITO (indium tin oxide) coated glass substrate was placed on a temperature variable substrate holder inside a cylindrical reaction chamber. The chamber was evacuated to $10^{-4}$ ($1.3 \times 10^{-2}$ Pa) torr and the substrate heated to 250° C. Neat silane was admitted to the chamber to bring the pressure up to about 0.1 torr (13 Pa). Once the pressure had stabilised, 1% by vol of diborane in hydrogen was added to the silane in the chamber. A glow discharge was initiated by exciting a capacitive plate system inside the reaction chamber from a radio frequency generator. This caused p-type amorphous silicon containing boron to be deposited on the ITO coated glass from the gas phase. After two minutes the diborane flow was terminated, thus causing a region of intrinsic (or undoped) material to be produced on top of the p-type region. This situation was maintained for 30 minutes. Finally, 1% by vol phosphine in hydrogen was progressively admitted to the reaction chamber and growth continued for a further six minutes. This caused n-type amorphous silicon containing phosphorus to be deposited on top of the i-type material. At this stage the discharge was extinguished, the phosphine flow was stopped and the device was allowed to cool under a flow of silane. When the device had cooled to room temperature it was removed from the reaction chamber and placed in a vacuum coater where several spots of aluminium 1 mm in diameter were evaporated onto the surface of the device.

Figure 1:
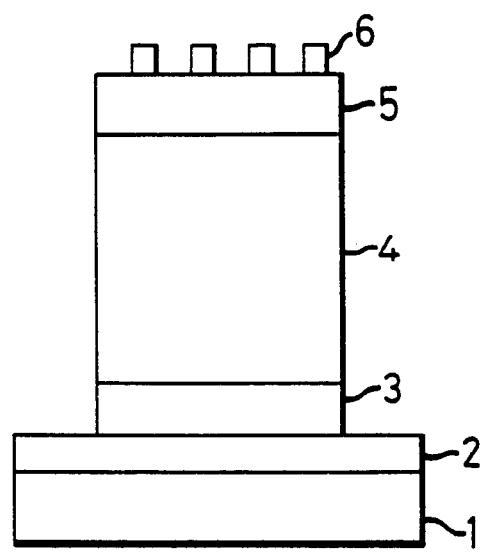
FIG. 1 is a diagrammatic side view of a memory device for use in the present invention.

The complete structure is shown in FIG. 1 wherein 1 represents the glass substrate, 2 the layer of ITO, 3 the layer of p-type silicon, 4 the layer of i-type, 5 the layer of n-type and 6 the aluminium spots. The p layer is about 200 A (20 nm) thick, the n layer about 500 A (50 nm) and the i layer about 2,000 A (200 nm).

Figure 2:
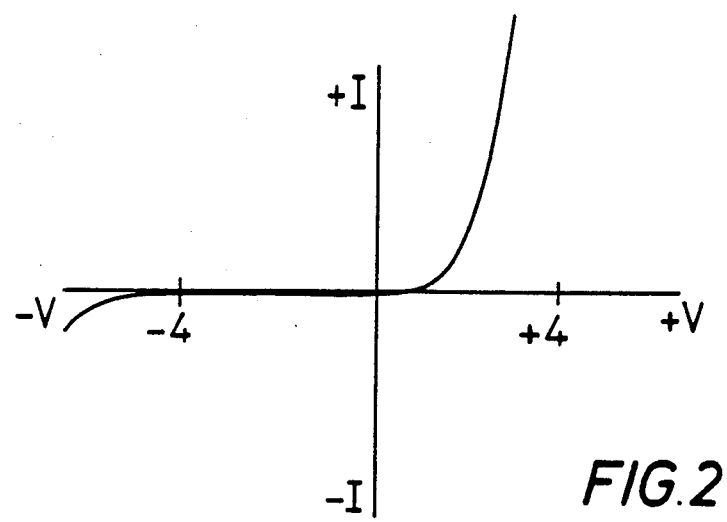
FIG. 2 is a graph of the current-voltage characteristic of a layered semiconductor structure prior to transformation into a memory device.

The device was placed on a curve tracer and its voltage/current characteristics examined. Initially these were in the form shown in FIG. 2. Finally a large reverse bias voltage of about 15 V was applied to the device. This step "conditions" the device into a memory (switching) device with the characteristics as shown in FIG. 3.

Figure 3:
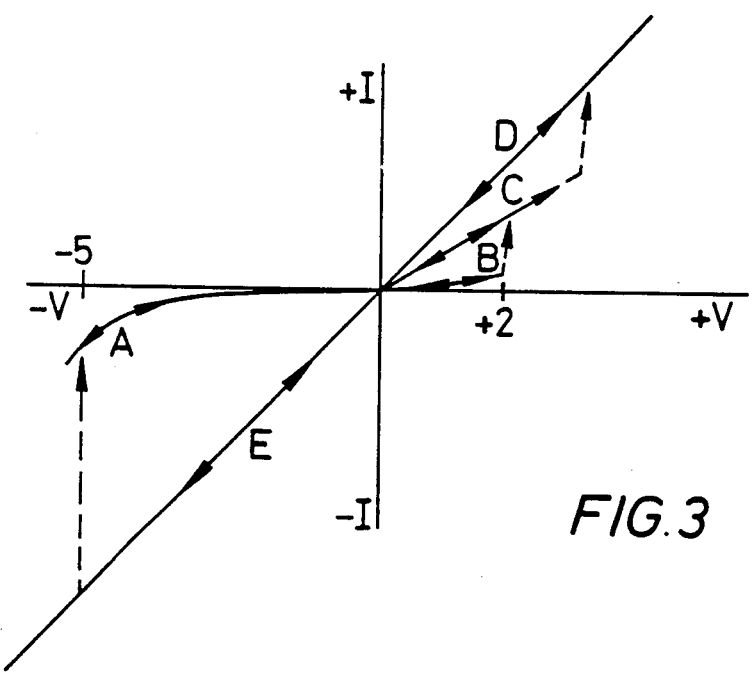
FIG. 3 is a graph of the current-voltage characteristic of a memory device produced by subjecting a structure having the electrical characteristics of FIG. 2 to a large reverse bias voltage.

Curves A and B in FIG. 3 show the device in its OFF state. Applying negative bias (curve A) has no effect on the conductivity state, applying forward bias (curve B) causes the device to switch to an intermediate conductivity state (curve C) at about 2 V. Further forward bias finally switches the device to its ON state, (curve D). Higher forward potentials have no further effect on the conductivity state. Applying negative bias now leaves the device in the ON state (curve E) until a potential of 5 V is attained, whereupon it immediately switches to its OFF state (curve A). This sequence of events is repeatable with no change in the ON-OFF conductivity or switching levels.

Figure 4A:
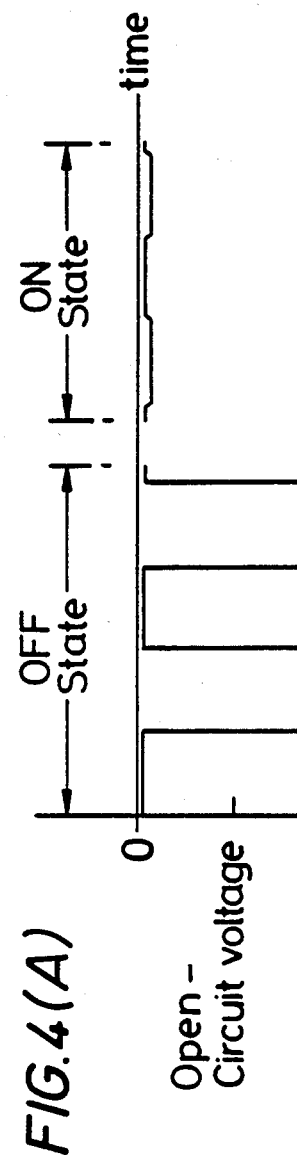
FIG. 4(A) is a graph showing the variation in open circuit voltage with time when a light pulse is applied to the device in the OFF and ON states respectively.
Figure 4B:
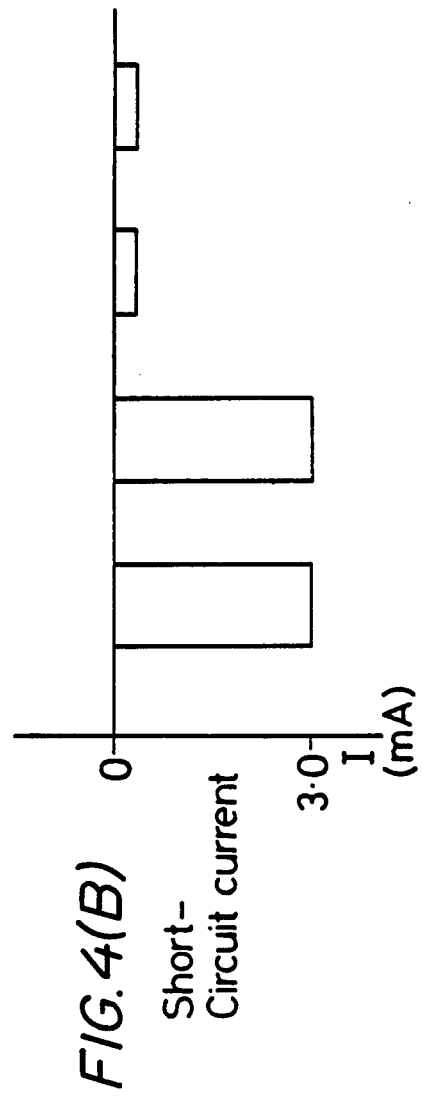
FIG. 4(B) is a graph showing the variation in short circuit current with time corresponding to FIG. 4(A)

Optical excitation of the memory element was achieved by directing the output of a 4 mW He-Ne laser through the glass-ITO substrate. By chopping the laser output at a frequency of 200 Hz, the laser induced memory reponse could be distinguished either directly on an oscilloscope, or via a phase-sensitive detector (PSD). FIG. 4(A) shows the effect of memory state on the laser induced open-circuit voltage; FIG. 4(B), the effect on short-circuit current. A distinct difference in photo response is apparent between the OFF and ON states.

Figure 5:
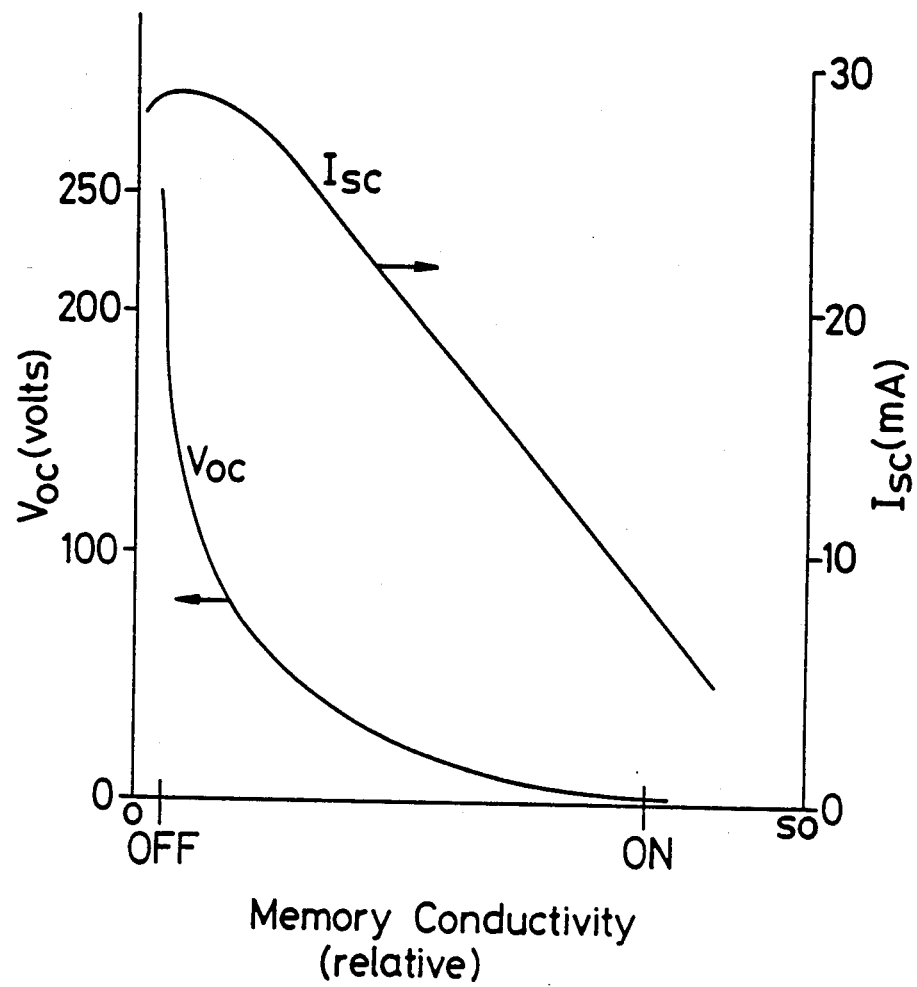
FIG. 5 shows the memory photovoltaic output (short circuit current and open circuit voltage) as a function of the conductivity of the memory device.

FIG. 5 shows the memory photovoltaic output as a function of the memory conductane; conductivity levels applicable to the OFF and ON states are indicated. The points between these extremes were obtained by switching the device carefully into intermediate conductivity values (eg curve C in FIG. 3) and then measuring response whilst this state was maintained, stability being adequate for the short experiment time required. It is apparent that the open-circuit voltage mode is extremely sensitive to memory conductivity and thus might be preferred in many applications.

We claim:

1. A process for detecting the conductance state of a non-volatile memory device which is switchable between a high conductance and a low conductance state and which comprises a plurality of amorphous or microcrystalline semiconductor layers at least one of which is a p-type layer in contact with an n or i-type layer, said device being formed by applying a sufficiently high voltage across said layers, characterised by irradiating the device with light of a wavelength which causes band to band excitation and of an intensity which produces a detectable photovoltaic response and using the photovoltaic response to determine the conductance state of the device.

2. A process according to claim 1 wherein the semiconductor material consists essentially of elements of Group IV of the Periodic Table.

3. A process according to claim 2 wherein the semiconductor material is silicon and/or silicon carbide.

4. A process according to claim 3 wherein the semiconductor material is amorphous silicon.

5. A process according to claim 1, 2, 3 or 4 wherein the current across the device produced by irradiation is measured to determine the conductance state of the device.

6. A process according to claim 1, 2, 3 or 4 wherein the voltage produced by irradiating the device is measured to determine the conductance state of the device.

7. A process according to claim 1, 2, 3 or 4 where the electrical power produced by irradiating the device is measured to determine the conductance state of the device.

* * * * *